United States Patent
Dwilinski et al.

(10) Patent No.: US 7,081,162 B2
(45) Date of Patent: Jul. 25, 2006

(54) METHOD OF MANUFACTURING BULK SINGLE CRYSTAL OF GALLIUM NITRIDE

(75) Inventors: Robert Dwilinski, Warsaw (PL); Roman Doradzinski, Warsaw (PL); Jerzy Garczynski, Lomianki (PL); Leszek Sierzputowski, Union, NJ (US); Yasuo Kanbara, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/479,856

(22) PCT Filed: Jun. 6, 2002

(86) PCT No.: PCT/JP02/05625

§ 371 (c)(1),
(2), (4) Date: Jun. 4, 2004

(87) PCT Pub. No.: WO02/101125

PCT Pub. Date: Dec. 19, 2002

(65) Prior Publication Data

US 2004/0244680 A1    Dec. 9, 2004

(30) Foreign Application Priority Data

Jun. 6, 2001    (PL) ........................................ 347918

(51) Int. Cl.
*C30B 25/12*    (2006.01)
(52) U.S. Cl. .......................................... 117/68; 117/75
(58) Field of Classification Search ................. 117/3, 117/68, 81, 83
See application file for complete search history.

(56) References Cited

U.S. PATENT DOCUMENTS

| 5,096,860 A | 3/1992 | Nadkarni |
| 5,456,204 A | 10/1995 | Dimitrov et al. |
| 5,589,153 A | 12/1996 | Garces |
| 5,780,876 A | 7/1998 | Hata |
| 5,868,837 A | 2/1999 | DiSalvo et al. |
| 5,928,421 A | 7/1999 | Yuri et al. |
| 6,067,310 A | 5/2000 | Hashimoto et al. |
| 6,156,581 A | 12/2000 | Vaudo et al. |
| 6,177,057 B1 | 1/2001 | Purdy |
| 6,372,041 B1 | 4/2002 | Cho et al. |
| 6,627,552 B1 | 9/2003 | Nishio et al. |
| 2001/0008656 A1 | 7/2001 | Tischler et al. |
| 2001/0022154 A1 | 9/2001 | Cho et al. |
| 2004/0139912 A1 | 7/2004 | Dwilinski |
| 2004/0244680 A1 | 12/2004 | Dwilinski et al. |

(Continued)

FOREIGN PATENT DOCUMENTS

CN    1289867 A    4/2001

(Continued)

OTHER PUBLICATIONS

PCT International Search Report regarding PCT/IB02/04185 dated Feb. 12, 2003.

(Continued)

*Primary Examiner*—Felisa Hiteshew
(74) *Attorney, Agent, or Firm*—Morrison & Foerster LLP

(57) ABSTRACT

The present invention provides a process for forming a bulk monocrystalline gallium nitride by using supercritical ammonia. The process comprises the steps of forming a supercritical solvent containing ion or ions of alkali metals in an autoclave; and dissolving a monocrystalline gallium nitride prepared by flux methods as a feedstock in this supercritical solvent to form a supercritical solution, and simultaneously or separately recrystallizing gallium nitride on the face of a seed.

47 Claims, 5 Drawing Sheets

U.S. PATENT DOCUMENTS

2004/0255840 A1    12/2004    Dwilinski et al.

FOREIGN PATENT DOCUMENTS

| | | |
|---|---|---|
| CN | 1065289 C | 5/2001 |
| EP | 0 711 853 B1 | 4/1995 |
| EP | 0 716 457 A2 | 12/1995 |
| EP | 0711853 B1 | 3/1999 |
| EP | 1088914 A1 | 4/2001 |
| FR | 2796657 | 7/1999 |
| GB | 2 326 160 A | 6/1998 |
| GB | 2 333 521 A | 6/1998 |
| JP | 07-022692 B2 | 3/1995 |
| JP | 8-250802 | 3/1995 |
| JP | 7-165498 | 6/1995 |
| JP | 10-7496 | 6/1996 |
| JP | 10-70079 | 8/1996 |
| JP | 09-134878 | 5/1997 |
| JP | 10-70338 | 8/1997 |
| JP | 11-54847 | 8/1997 |
| JP | 4170070079 A | 3/1998 |
| JP | 11-307813 | 4/1998 |
| JP | 2000-82863 | 9/1998 |
| JP | 2001-342100 | 9/2000 |
| JP | 2003040699 A | 2/2003 |
| JP | 2004168656 A | 6/2004 |
| WO | WO 98/55671 | 6/1998 |
| WO | WO 01/24284 | 9/2000 |
| WO | WO 01/24921 A1 | 4/2001 |
| WO | WO-02101120 A2 | 12/2002 |

OTHER PUBLICATIONS

Search Report regarding GB 9812653.5 dated Aug. 26, 1998.
Search Report regarding GB 9909959.0 dated May 19, 1999.
International Search Report regarding PCT/JP02/12969 dated Mar. 20, 2003.
International Search Report regarding PCT/JP02/13079 dated Mar. 20, 2003.
International Search Report regarding PCT/PL02/00077 dated Mar. 21, 2003.
International Search Report regarding PCT/JP02/11136 dated Feb. 4, 2003.
International Search Report regarding PCT/IB02/04441 dated Feb. 3, 2003.
K. Pakula et al., "Growth of GaN Metalorganic Chemical Vapour Deposition Layers on GaN Single Crystals", Acta Physica Polonica A vol. 88 No. 5 (1995) pp. 861-864.
R. Dwilinski et al., "Exciton Photo-Luminescence Of Gan Bulk Crystals Grown By The AMMONO Method", Materials Science and Engineering B50 (1997) pp. 46-49.
Ketchum et al., "Crystal Growth of Gallium Nitride in Supercritical Ammonia", Journal of Crystal Growth 222 (2001) pp. 431-434.
R. Dwilinski et al., "On GaN Crystallization By Ammonothermal Method", Acta Physica Polonica A vol. 90 No. 4 (1996) pp. 763-766.
R. Dwilinski et al., "AMMONO Method of BN, AlN and GaN Synthesis and Crystal Growth", MRS Internet Journal Nitride Semiconductor Research 3, 25 (1998) pp. 1-4.
Yano et al., "Control of Nucleation Site and Growth Orientation of Bulk GaN Crystals", Jpn. J Appl. Phys. vol. 38 (1999) pp. L1121-L1123.
Aoki et al., "Growth of GaN Single Crystals From a Na-Ga Melt at 750° C. and 5MPa of $N_2$", Journal of Crystal Growth 218 (2000) pp. 7-12.
Yamane et al., "Polarity of GaN Single Crystals Prepared with Na Flux", Jpn. J. Appl. Phys. vol. 37.
R. Dwilinski et al., "AMMONO Method of GaN and AlN Production", Diamond and Related Materials 7 (1998) pp. 1348-1350.
A. Kuramata et al., "Substrates for III-V Nitride Semiconductors", (1996) pp. 936-940 relevant text translated in English.
Y. Melnik et al., "Properties of Free-Standing Gan Bulk Crystals Grown by HPVE", Mat. Res. Soc. Symp. Proc. vol. 482 (1996) pp. 269-274.
C.M. Balkas et al., "Growth of Bulk AlN and GaN Single Crystals by Sublimation", Mat. Res. Soc. Symp. Proc. vol. 449 (1997) pp. 41-46.
S. Porowski, "Bulk and Homoepitaxial GaN-growth and Characterisation", Journal of Crystal Growth 189/190 (1998) pp. 153-158.
PTO-892 issued in U.S. Appl. No. 10/479,856.
D. Ketchum, et al., "Crystal growth of gallium nitride in supercritical ammonia", *Journal of Crystal Growth*, vol. 222, Jul. 18, 2000.
R. Dwilinski, et al., "AMMONO method of GaN and AlN production", *Diamond and Related Materials*, vol. 7, May 18, 1998.
Melnik et al. "Properties of Free-Standing GaN Bulk Cyrstals Grown by HPVE", Mat. Res. Soc. Symp. Proc. vol. 482 (1998) pp. 269-274.
Balkas et al., "Growth of Bulk AlN and GaN Single Crystals by Sublimination", Mat. Res. Soc. Symp. Proc. vol. 449 (1997) pp. 41-46.
Porowski et al. "Bulk and Homoepitaxial GaN-Growth and Characterisation", Journal of Crystal Growth, 189/190 (1998) pp. 153-158.
*Preliminary Notice of Rejection of the IPO* (Translation), 3 pages.
Journal of Physics Condensed Matter, v13, n32, Aug. 13, 2001, pp. 6875-6892.
Physica Status Solidi (a) Applied Research, v180, n1, 2000, pp. 51-58.
Mao et al., "New Concept Technology Pressure-Variation Liquid Phase Epitaxy", SPIE Photonics Taiwan Conference Proceeding, Jul. 2000, pp. 1-12.
Chinese Office Action dated Apr. 8, 2005, directed to corresponding Chinese application 02801950.4.
U.S. Office Action dated Apr. 20, 2005, directed to corresponding U.S. Appl. No. 10/479,807.
Akasaki, I. et al. (1991), "Growth and Properties of Single Crystalline GaN Films by Hydride Vapor Phase Epitaxy," *Crystal Properties and Preparation* 32-34:154-157.
Chu, T. L. et al. (1974), "Growth and Characterization of Gallium Nitride," *J. Electrochem. Soc.: Solid-State Science and Technology* 121-1:159-162.
Dwilinski, R. et al. (1998). "AMMONO Method of BN, AlN and GaN Synthesis and Crystal Growth," *MRS Internet J. Nitride Semicond. Res.* 3/25:1-4.
Kaschner, A. et al. (1999). "Influence of Doping on the Lattice Dynamics of Gallium Nitride," *MRS Internet J. Nitride Semicond. Res.* 4S1, G3.57.
Kim, S. T. et al. (1998). "Preparation and Properties of Free-standing HPVE Grown GaN Substrates," *Journal of Crystal Growth* 194:37-42.
Kuroda, Naotaka et al. (1998). "Precise Control of Pn-junction Profiles for GaN-based LD structures Using GaN Substrates with Low Dislocation Densities," *Journal of Crystal Growth* 189/190:551-555.

Motoki, Kensaku et al. (2001). "Preparartion of Large Freestanding GaN Susbtrates by Hydride Vapor Phase Epitaxy Using GaAs as a Starting Substrate," *J. Appl. Phys.* 40:L140-L143.

Shin-ichi Hirano et al. (1989) "Hydrothermal Synthesis of Gallium Orthophosphate Crystals," Bull. Chem. Soc. Jpn. 62, pp. 275-278.

(1997). "Single Crystal Growth," Chapter 1 In Hydrothermal Synthesis Handbook. Gihodo Press, Second Edition, pp. 245-255.

R.A. Laudise (1991). "What is Materials Chemistry?" Chapter 27 In Materials for NonLinear Optics: Chemical Perspectives. American Chemical Society. pp. 410-433.

Noboru Sakagami et al. (1974) "Growth Kinetics and Morphology of ZnO Single Crystal Grown under Hydrothermal Conditions," *Journal of the Ceramic Association* 82, pp. 405-413.

T. Sekiguchi et al. (2000) "Hydrothermal Growth of ZnO Single Crystals and their Optical Characterization," *Journal of Crystal Growth* 214/215, pp. 72-76.

K. Yanagisawa et al. (1996) "Hydrothermal Single Growth of Calcite in Ammonium Acetate Solution," *Journal of Crystal Growth* 163, pp. 285-294.

K. Yanagisawa et al. (2001) "Improvement of Quality of Hydrothermally Grown Calcite Single Crystals," *Journal of Crystal Growth* 229, pp. 440-444.

S. Hirano (1991) "Growth of Gallium Orhophosphate Single Crystals in Acidic Hydrothermal Solutions," *Journal of Materials Science* 24, pp. 2805-2808.

Notification from Japanese Patent Office dated Mar. 29, 2005 and Submission of Printed Publication.

METHOD OF MANUFACTURING BULK SINGLE CRYSTAL OF GALLIUM NITRIDE

TECHNICAL FIELD

The present invention relates to a process for growing a bulk monocrystalline gallium nitride by crystallizing from a supercritical solution on a seed. In particular, by way of a technique of making use of a supercritical $NH_3$, the invention pertains to a process for obtaining a bulk monocrystalline gallium nitride by recrystallizing a gallium nitride prepared by flux methods.

BACKGROUND ART

The methods using supercritical ammonia are proposed as the process for forming a bulk monocrystalline gallium nitride so as to lower the temperature and the pressure for a growing step. One of the methods is to grow GaN crystal by synthesizing ammonia containing alkali metal amide ($KNH_2$ or $LiNH_2$), where Gallium is used as a feedstock, by setting the reaction temperature below 550° C., pressure below 5 kbar, and the resultant grown crystal is 5 µm. ["ammono method of BN, AlN, and GaN synthesis and crystal growth" R. Dwilinski et al., Proc. EGW-3, Warsaw, Jun. 22–24, 1998, MRS Internet Journal of Nitride Semiconductor Research] Another method is to recrystallize gallium nitride by using commercially available GaN powder. ["Crystal Growth of gallium nitride in supercritical ammonia", J. W. Kolis et al., J. Cryst. Growth 222, 431–434 (2001)]. However, the former is a method using gallium metal as a feedstock and the reaction control is difficult. Although the latter is a recrystallizing method using GaN as a feedstock, only GaN crystal about 0.5 mm was obtained and no bulk monocrystalline was obtained. We believe this was caused because neither chemical transport in the supercritical solution nor growth on a seed was seen. Gallium nitride as a raw material does not exist in nature, differently from quartz crystal, therefore it is difficult to supply.

DISCLOSURE OF INVENTION (Problems to be Solved by the Invention)

An object of the present invention is, therefore, to provide a process for forming a bulk monocrystalline gallium nitride on a seed by recrystallizing a monocrystalline gallium nitride prepared by flux methods. Another object of the present invention is to grow a bulk crystalline gallium nitride as a substrate for optics in order to improve the quality of the substrate by recrystallizing a monocrystalline gallium nitride prepared by flux methods.

(Means for Solving the Problems)

The first invention for achieving the above objects is based on the mass of monocrystalline gallium nitride prepared by flux methods, and a recrystallized monocrystalline gallium nitride can be obtained by a chemical transport caused in a supercritical ammonia solvent containing at least one mineralizer for imparting an ammono-basic property. According to the first invention, there is provided a process for forming a bulk monocrystalline gallium nitride, comprising the steps of dissolving the mass of monocrystalline gallium nitride prepared by flux methods in a supercritical solvent containing ammonia and alkali metal ion or ions in an autoclave, so as to form a supercritical solution containing gallium nitride whose solubility has a negative temperature coefficient; and selectively crystallizing gallium nitride only on the face of a seed arranged in the autoclave, from the above supercritical solution introduced, by taking advantage of the negative temperature coefficient of the solubility of gallium nitride.

Further, according to the first invention, there is also provided a process for forming a bulk monocrystalline gallium nitride, comprising the steps of dissolving the mass of monocrystalline gallium nitride prepared by flux methods in a supercritical solvent containing ammonia and alkali metal ion or ions in an autoclave, so as to form a supercritical solution containing gallium nitride whose solubility has a positive pressure coefficient; and selectively crystallizing gallium nitride only on the face of a seed arranged in the autoclave, from the above supercritical solution introduced, by taking advantage of the positive pressure coefficient of the solubility of gallium nitride.

The step of introducing the supercritical solution dissolving gallium nitride in the first invention needs gallium nitride as a raw material which does not exist in nature, differently from the hydrothermal synthesis of quartz crystal. Therefore, the mass of monocrystalline gallium nitride prepared by flux methods is used as a feedstock (raw material). Said feedstock is a monocrystalline gallium nitride prepared by flux methods represented by Na flux method (reaction between Ga metal and nitrogen in alkali metal solution) and is defined as an object which can be physically fixed under the condition of non-dissolution by convection flow of supercritical solution in the autoclave.

In above method, the resulted concentration of gallium nitride in supercritical solution is preferably adjusted to no more than its solubility at a temperature of crystallization so as to prevent the spontaneous crystallization growth during the subsequent process.

In the first invention, it is essential that the second step of crystallization should be carried out selectively on the face of the seed. Therefore, the another invention is a process for crystallizing a bulk monocrystalline gallium nitride, characterized in that the a bulk monocrystalline gallium nitride is dissolved in the supercritical solvent containing ammonia and alkali metal ion or ions, so as to form the supercritical solution of gallium nitride whose solubility has a negative temperature coefficient; that the supercritical solution is adjusted below a certain concentration which does not allow spontaneous crystallization, while maintaining the oversaturation of the supercritical solution relative to a seed, by raising the temperature to a predetermined temperature or reducing the pressure to a predetermined pressure, at least in a zone where the seed is arranged; and that gallium nitride is crystallized and selectively grown only on the face of the seed arranged in the autoclave.

In this invention, it is preferable that, in case where two zones, i.e., the dissolution zone and the crystallization zone are simultaneously formed in the autoclave, the oversaturation of the supercritical solution relative to the seed is maintained by controlling the dissolution temperature and the crystallization temperature. The control is found to be easy by setting the temperature of the crystallization zone at a temperature of 400 to 600° C., and by maintaining the difference in temperature between the dissolution zone and the crystallization zone within the autoclave, to 150° C. or less, preferably 100° C. or less. Preferably, the adjustment of oversaturation of the supercritical solution relative to the seed is made by providing at least one baffle for dividing the internal of the autoclave into a lower temperature dissolution zone and a higher temperature crystallization zone and controlling the convection amounts of the dissolution zone and the crystallization zone.

In the first invention, the above alkali metal ion or ions are added in the form of an alkali metal or a mineralizer containing no halogen, and the alkali metal ion or ions are of at least one selected from the group consisting of $Li^+$, $Na^+$ and $K^+$.

The process of the present invention is based on an ammonobasic reaction. A raw material is the mass of monocrystalline gallium nitride prepared by flux methods and may originally contains Na or other alkali metals so far as the ammonobasic supercritical reaction is not hindered, since alkali metal is a required element as a mineralizer.

The reaction control of crystallization is found to be easy by using the mass of monocrystalline gallium nitride prepared by flux methods as a raw material. In this case, monocrystalline gallium nitride is preferably used as the seed.

The present invention provides a following embodiment as a process for concurrently and separately carrying out the above first dissolution step and the above second crystallization step in an autoclave. That is, the following embodiment relates to a process for forming a bulk monocrystalline gallium nitride, which comprises the steps of forming a supercritical ammonia solvent containing alkali metal ion or ions in the autoclave, dissolving the mass of monocrystalline gallium nitride prepared by flux methods in the supercritical ammonia solvent, and crystallizing gallium nitride on the face of a seed, from the supercritical solution of the mass of monocrystalline gallium nitride prepared by flux methods, under the conditions of a higher temperature and/or a lower pressure than the temperature and/or the pressure found while the the mass of monocrystalline gallium nitride prepared by flux methods is dissolved in the supercritical solvent.

In the first embodiment, it is preferable that, separately from the step of dissolving the mass of monocrystalline gallium nitride prepared by flux methods, a step of moving the supercritical solution to a higher temperature and/or a lower pressure zone is provided. At least two zones between which a temperature difference arises are simultaneously formed in the autoclave, and the mass of monocrystalline gallium nitride prepared by flux methods is located in the lower temperature dissolution zone, and the seed is located in the higher temperature crystallization zone. It is necessary that the difference in temperature between the dissolution zone and the crystallization zone should be set within such a range that a chemical transport in the supercritical solution can be ensured and can be carried out mainly by convection. The difference in temperature therebetween is generally 1° C. or more, preferably 5 to 150° C., more preferably 100° or less.

In the present invention, gallium nitride may contain a donor, an acceptor, or a magnetic dopant, as required. As will be defined later, the supercritical solvent contains $NH_3$ or a derivative thereof. The mineralizer contains alkali metal ions, at least, ions of sodium or potassium.

In the present invention, the seed has a crystalline layer of a nitride containing at least gallium or other element of Group III. And said seed has a crystalline layer of gallium-containing nitride with a dislocation density of $10^6/cm^2$ or less. A seed is preferably gallium nitride prepared by flux methods. It is preferable that the full width at half maximum (FWHM) of the X-ray rocking curve from (0002) plane is 120 arcsec. or less.

In the present invention, the crystallization of gallium nitride is carried out at a temperature of 100 to 800° C., preferably 300 to 600° C., more preferably 400 to 550° C.

Also, the crystallization of gallium nitride is carried out under a pressure of 100 to 10,000 bar, preferably 1,000 to 5,500 bar, more preferably 1,500 to 3,000 bar.

The concentration of alkali metal ions in the supercritical solvent is so adjusted as to ensure the specified solubilities of the mass of monocrystalline GaN prepared by flux methods and gallium-containing nitride as a seed, and the molar ratio of the alkali metal ions to other components of the resultant supercritical solution is controlled within a range from 1:200 to 1:2, preferably from 1:100 to 1:5, more preferably from 1:20 to 1:8.

In this regard, the present invention relates to a technique of an ammono-basic growth of a crystal which comprises a chemical transport in a supercritical ammonia solvent containing at least one mineralizer for imparting an ammono-basic property to grow a monocrystalline gallium nitride. This technique has a very high originality, and therefore, the terms herein used should be understood as having the meanings defined as below in the present specification.

The term "gallium nitride prepared by flux methods" in the specification means a nitride reaction in Ga metal solution represented by Na flux method. Nitrogen atmosphere is applied inside a crucible made by BN (boron nitride). Consequently, Ga metal and Na metal are added, setting the conditions of 50 atm and 750° C. The autoclave was kept under these conditions for 7 days or more so that monocrystalline gallium nitride is formed a plate shaped mass from 1 to 10 mm.

The term "bulk monocrystalline gallium nitride" means a monocrystalline gallium nitride substrate on which an optic and electronic device such as LED or LD can be formed by an epitaxial growing process such as MOCVD, HVPE or the like.

The term "supercritical ammonia solvent" means a supercritical solvent which contains at least ammonia, and ion or ions of at least one alkali metal for dissolving GaN.

The term "mineralizer" means a supplier for supplying one or more of alkali metal ions for dissolving gallium nitride in the supercritical ammonia solvent, and specific examples thereof are described in the present specification.

The term "supercritical ammonia solution" means a mixture of the supercritical ammonia solvent and a soluble gallium nitride formed by the dissolution of the mass of monocrystalline gallium nitride prepared by flux methods. Based on our experiment, we have found that there is an equilibrium relationship between the gallium nitride solid and the supercritical solution under a sufficiently high temperature and pressure atmosphere. Accordingly, the solubility of the soluble gallium nitride can be defined as an equilibrium concentration of the above soluble gallium nitride in the presence of the solid gallium nitride. In such a process, it is possible to shift this equilibrium according to change in temperature and/or pressure.

The phrase "negative temperature coefficient of the solubility" means that the solubility is expressed by a monotonically decreasing function of the temperature, when all other parameters are kept constant. Similarly, the phrase "positive pressure coefficient of the solubility" means that the solubility is expressed by a monotonically increasing function of the pressure, when all other parameters are kept constant. Based on our research, the solubility of soluble gallium nitride in the supercritical ammonia solvent, at least, has a negative temperature coefficient within a range of 300 to 550° C., and a positive pressure coefficient within a range of 1 to 5.5 Kbar, respectively.

The phrase "the oversaturation of the supercritical ammonia solution of gallium nitride" means that the concentration of the soluble GaN in the above supercritical ammonia solution is higher than a concentration in an equilibrium state, i.e., the solubility of gallium nitride. In case of the dissolution of gallium nitride in a closed system, such oversaturation can be achieved, according to a negative temperature coefficient or a positive pressure coefficient of the solubility, by raising the temperature or reducing the pressure.

The phrase "the chemical transport of gallium nitride in the supercritical ammonia solution" means a sequential process including the dissolution of the mass of monocrystalline gallium nitride prepared by Na flux method, the transfer of the soluble GaN through the supercritical ammonia solution, and the crystallization of gallium nitride from the oversaturated supercritical ammonia solution. In general, a chemical transport process is carried out by a certain driving force such as a temperature gradient, a pressure gradient, a concentration gradient, difference in chemical or physical properties between a dissolved gallium nitride and a crystallized product, or the like. Preferably, the chemical transport in the process of the present invention is achieved by carrying out the dissolution step and the crystallization step in separate zones, on condition that the temperature of the crystallization zone is maintained higher than that of the dissolution zone so that bulk monocrystalline gallium nitride can be obtained by the processes of this invention.

The term "seed" has been described by way of examples in the present specification. The seed provides a region or area on which the crystallization of gallium-containing nitride is allowed to take place, and the growth quality of the crystal depends on the quality of the seed. Thus, the type of seed is selected from such crystals that are analogous to a crystal to be grown and have good qualities.

The term "spontaneous crystallization" means an undesirable phenomenon in which the formation and the growth of the core of gallium nitride from the oversaturated supercritical ammonia solution occur at any site inside the autoclave, and the spontaneous crystallization also includes disoriented growth of the crystal on the surface of the seed.

The term "selective crystallization on the seed" means a step of allowing the crystallization to take place on the seed, accompanied by substantially no spontaneous growth. This selective crystallization on the seed is essential for the growth of a bulk monocrystal, and it is one of the methods of the present invention.

The autoclave to be used in the present invention is a closed system reaction chamber for carrying out the ammono-basic growth of the crystal, and it may be in any form.

In this regard, the temperature distribution in the autoclave as will be described later in the part of Examples is determined by using the autoclave empty inside without the supercritical ammonia, and thus, the supercritical temperature is not one actually measured. On the other hand, the pressure in the autoclave is directly measured, or it is determined by the calculation from the amount of ammonia firstly introduced, and the temperature and the volume of the autoclave.

It is preferable to use an apparatus as described below, to carry out the above process. The present invention provides an apparatus for forming a bulk monocrystalline gallium nitride which comprises an autoclave (1) for producing a supercritical solvent, a convection-controller (2) arranged in the autoclave, and a furnace unit (4) equipped with a heater (5) or a cooler (6), in which the autoclave is set.

The furnace unit (4) includes a higher temperature zone equipped with a heater (5) which corresponds to a crystallization zone (14) in the autoclave (1), and a lower temperature zone equipped with a heater (5) or a cooler (6) which corresponds to a dissolution zone (13) in the autoclave (1); or otherwise, the furnace unit (4) includes a higher temperature zone equipped with a heater (5) or a cooler (6) which corresponds to a crystallization zone (14) in the autoclave (1), and a lower temperature zone equipped with a heater (5) or a cooler (6) which corresponds to a dissolution zone (13) in the autoclave (1). The convection controller (2) may be composed of at least one horizontal baffle (12) which has a hole at the center or at its periphery and which partitions the crystallization zone (14) from the dissolution zone (13). Inside the autoclave (1), gallium nitride prepared by flux methods (16) is set in the dissolution zone (13), and a seed (17) is set in the crystallization zone (14), and the convection of a supercritical solution between the zones (13) and (14) is controlled by the controller (2). It is to be noted that the dissolution zone (13) is located above the horizontal baffle (12), and the crystallization zone (13), below the baffle (12).

BEST MODE FOR CARRYING OUT THE INVENTION

Figure 1:
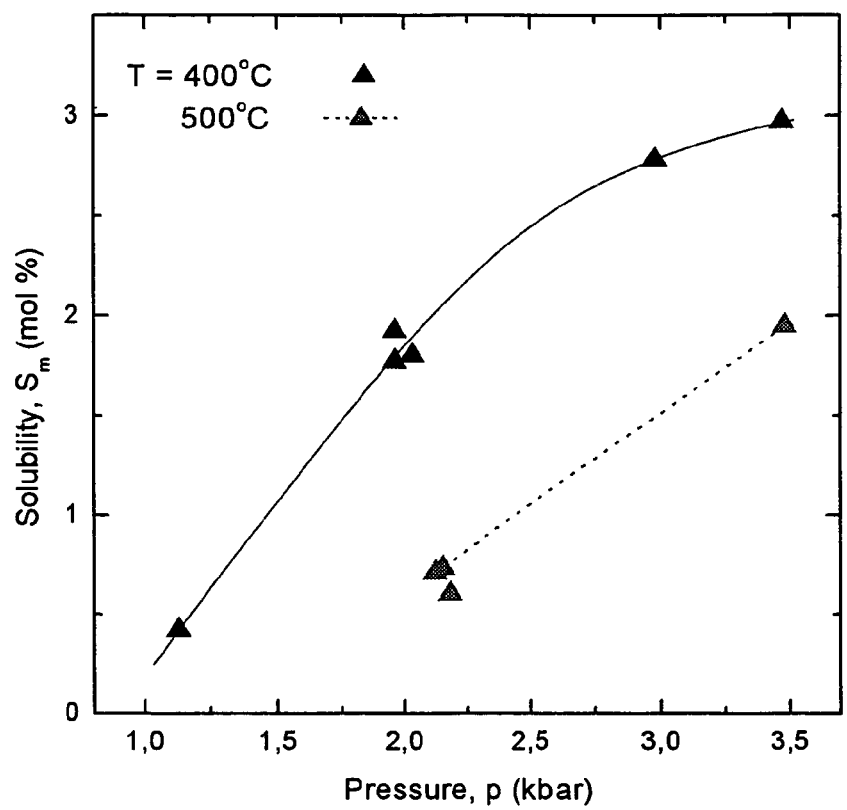
FIG. 1 shows a relation between pressure and GaN solubility in supercritical ammonia containing potassium amide (at molar ratio of $KNH_2:NH_3=0,07$) at $T=400°$ C. and $T=500°$ C.

The process of the present invention is divided into two steps, that is, a step of dissolving the mass of monocrystalline gallium nitride prepared by flux methods, and a step of moving a supercritical solution to a higher temperature zone or a lower pressure zone where the growth of gallium nitride on the face of a seed is carried out. Otherwise, it is also possible to divide the autoclave into at least two zones which have a difference in temperature from each other, and to set a mass of monocrystalline gallium nitride prepared by flux methods in a lower temperature dissolution zone, and a seed, in a higher temperature crystallization zone. The difference in temperature between the dissolution zone and the crystallization zone is selected within such a range that a chemical transport in the supercritical solution can be caused by convection. In this case, the difference in temperature between the dissolution zone and the crystallization zone is 1° C. or more. Gallium nitride may contain a donor, an acceptor, a magnetic dopant, etc. As a supercritical solvent, ammonia ($NH_3$) or its derivative containing ion or ions of alkali metals (at least potassium) may be used. The seed has a crystalline layer of a nitride which contains, at least, gallium or other element of Group No. 13 (IUPAC, 1989) and preferably has a surface dislocation density of $10^6/cm^2$ or less.

The crystallization of gallium nitride is carried out under the conditions where the temperature is from 100 to 800° C., and the pressure, from 100 to 10,000 bar, while the concentration of alkali metal ions in the supercritical solvent is so controlled that appropriate solubility of the gallium nitride can be ensured, and the molar ratio of the alkali metal ions to other components in the supercritical solvent is controlled within a range of from 1:200 to 1:2.

The apparatus for forming a monocrystalline gallium nitride comprises an autoclave equipped with a convention controller, which is to produce a supercritical solvent; and at least one furnace unit equipped with a heater and/or a cooler, in which the autoclave is set. The furnace unit includes a higher temperature zone equipped with a heater which corresponds to the crystallization zone in the autoclave, and a lower temperature zone equipped with a heater and/or a cooler which corresponds to the dissolution zone in the autoclave. It is also possible to use a furnace unit which includes a higher temperature zone equipped with a heater and/or a cooler, and a lower temperature zone equipped with a heater and/or a cooler. The convection controller is composed of at least one horizontal baffle having a hole at the center or its periphery so as to partition the crystallization zone from the dissolution zone. Thus, the mass of monocrystalline gallium nitride prepared by flux methods is set in the dissolution zone, and the seed, in the crystallization zone, in the autoclave. The convection of the supercritical solution between the dissolution zone and the crystallization zone is controlled by the above controller. The dissolution zone is located above the horizontal baffle, and the crystallization zone, below the horizontal baffle.

Based on the result of the research, an obtainable best bulk monocrystalline gallium nitride has a surface dislocation density of about $10^4/cm^2$, and the full width at half maximum of the X-ray from the surface (0002) is 60 arcsec. or less. Therefore, a semiconductor device using such a bulk monocrystalline gallium nitride can ensure a proper quality and a proper lifetime.

Gallium nitride shows a good solubility in ammonia ($NH_3$) containing an alkali metal or a compound thereof ($KNH_2$ or the like). In a graph of FIG. 1, a solubility of gallium nitride in supercritical solvent is shown as a function of pressure at a temperature of 400° C. and 500° C. Said solubility is defined as molar percentage (%), S≡GaN (solution):($KNH_2+NH_3$)×100%. In this case, the solvent refers to the $KNH_2$ solvent in supercritical ammonia; molar ratio X≡$KNH_2$:$NH_3$=0.07. According to said graph, the solubility is a monotonically increasing function of the pressure, and also a monotonically decreasing function of the temperature. By making use of this relationship, gallium-containing nitride is dissolved under a condition where the solubility becomes higher, and gallium nitride is crystallized under a condition where the solubility becomes lower, so that a bulk monocrystalline gallium nitride can grow. This negative temperature gradient indicates that, if a difference in temperature arises, the chemical transport of gallium nitride is carried out from the lower temperature dissolution zone to the higher temperature crystallization zone. Next, an oversaturated solution relative to gallium nitride is formed by appropriately changing the conditions, for example, by heating, so that a crystal is grown on the face of the seed.

The process of the present invention makes it possible to grow a bulk monocrystalline gallium nitride on the face of the seed, which leads to stoichiometric growth of GaN obtained as a bulk monocrystalline layer on a seed of monocrystalline gallium nitride. The above monocrystal is grown in the supercritical solution containing alkali metal ion or ions, and therefore, the resultant monocrystal also contains 0.1 ppm or more of alkali metal. In addition, to maintain the basic property of the supercritical solution in order to prevent the corrosion of the apparatus, no halide is intentionally added to the solvent. Further, the bulk monocrystalline gallium nitride may be doped with a donor (e.g., Si, O, etc.), an acceptor (e.g., Mg, Zn, etc.) and a magnetic substance (e.g., Mn, Cr, etc.) at a concentration of $10^{17}$ to $10^{21}/cm^3$. The optical, electrical and magnetical characteristics of gallium-containing nitride can be changed by this doping. As other physical properties, the grown bulk monocrystalline gallium nitride has a surface dislocation density of $10^6/cm^2$ or less, preferably $10^5/cm^2$ or less, more preferably $10^4/cm^2$ or less. It is possible to grow a bulk monocrystalline gallium nitride where the full width at half maximum of the X-ray from the surface (0002) is 600 arcsec. or less, preferably 300 arcsec or less, more preferably 60 arcsec or less.

EXAMPLES

Example 1

Figure 2:
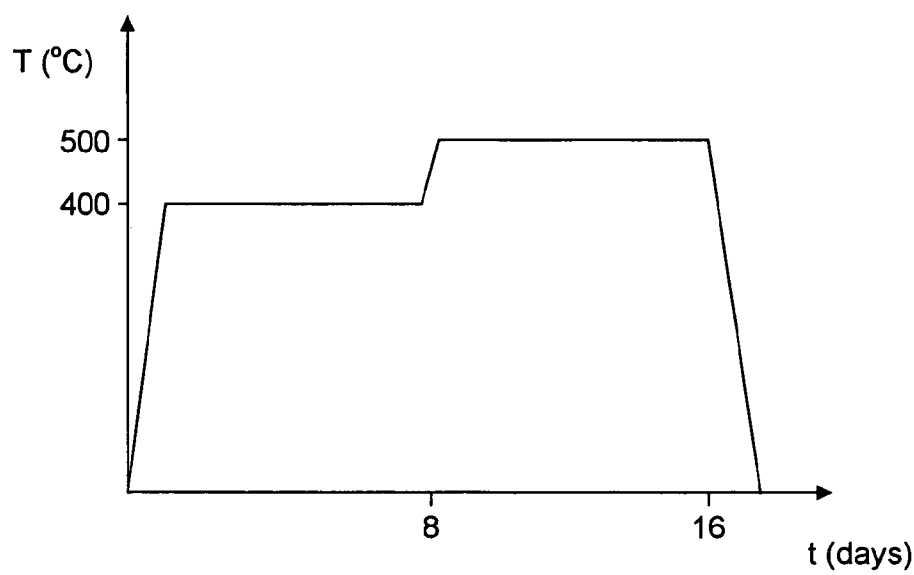
FIG. 2 shows a graph illustrating a change in temperature in an autoclave with the passage of time, on condition that the pressure is kept constant, in case of Example (1).

Two crucibles are introduced into the high-pressure autoclave having a volume of 10.9 $cm^3$ made on the basis of a known design solution [H. Jacobs, D. Schmidt, Current Topics in Materials Science, vol. 8, ed. E. Kaldis (North-Holland, Amsterdam, 1981), 381], one containing 0.4 g of GaN in the form of 0.1 mm thin strips prepared by Na flux method, second containing 0.1 g of seed with 0.2 mm thickness prepared by HVPE method. 0.72 g of 4N purity metallic potassium is introduced into the autoclave. The autoclave is filled with 4.81 g of ammonia, and closed. The autoclave is introduced into the furnace and heated to 400° C. Pressure inside the autoclave is 2 kbar. The temperature is increased to 500° C. after 8 days, with pressure maintained at 2 kbar. The autoclave is kept under such conditions for another 8 days (FIG. 2). The process leads to total dissolution of GaN which is a feedstock, prepared by Na flux method and recrystallization of the GaN layer on the partly dissolved seed. Both sides of the monocrystalline layer have a total thickness about 0.4 mm.

Example 2

Figure 3:
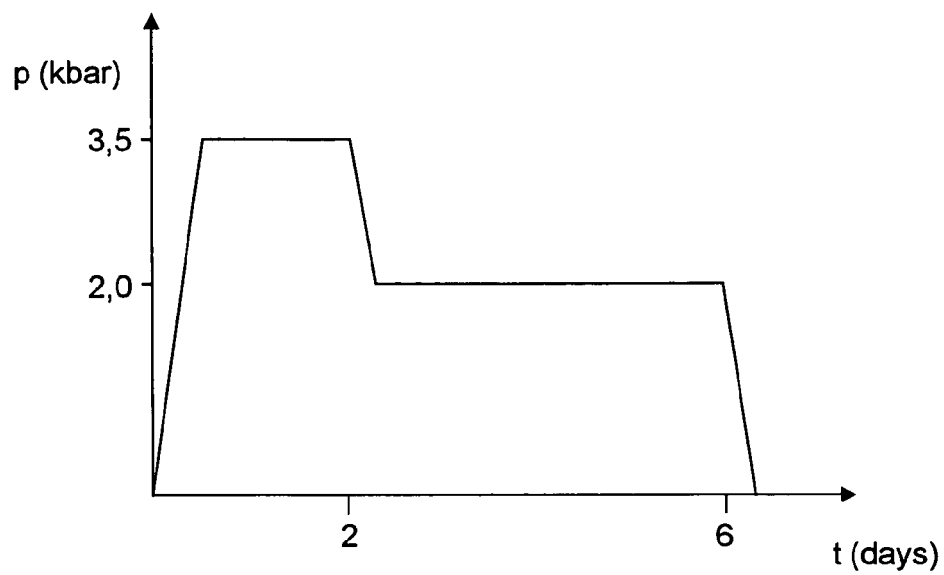
FIG. 3 shows a graph illustrating a change in pressure in an autoclave with the passage of time, on condition that the temperature is kept constant, in case of Example (2).

Two crucibles are introduced into the high-pressure autoclave having a volume of 10.9 $cm^3$, one containing 0.4 g of GaN in the form of 0.1 mm thin strips prepared by Na flux method, second containing 0.1 g of seed with double thickness prepared by HVPE method. 0.82 g of 4N purity metallic potassium is introduced into the autoclave. The autoclave is filled with 5.43 g of ammonia, and closed. The autoclave is introduced into the furnace and heated to 500° C. Pressure inside the autoclave is 3.5 kbar. After 2 days, the pressure is decreased to 2 kbar, temperature is maintained at 500° C. and the autoclave is kept under such conditions for another 4 days (FIG. 3). The process leads to total dissolution of GaN prepared by Na flux method and recrystallization of the GaN layer on the partly dissolved seed. Both sides of the monocrystalline layer have a total thickness about 0.25 mm.

Example 3

Figure 4:
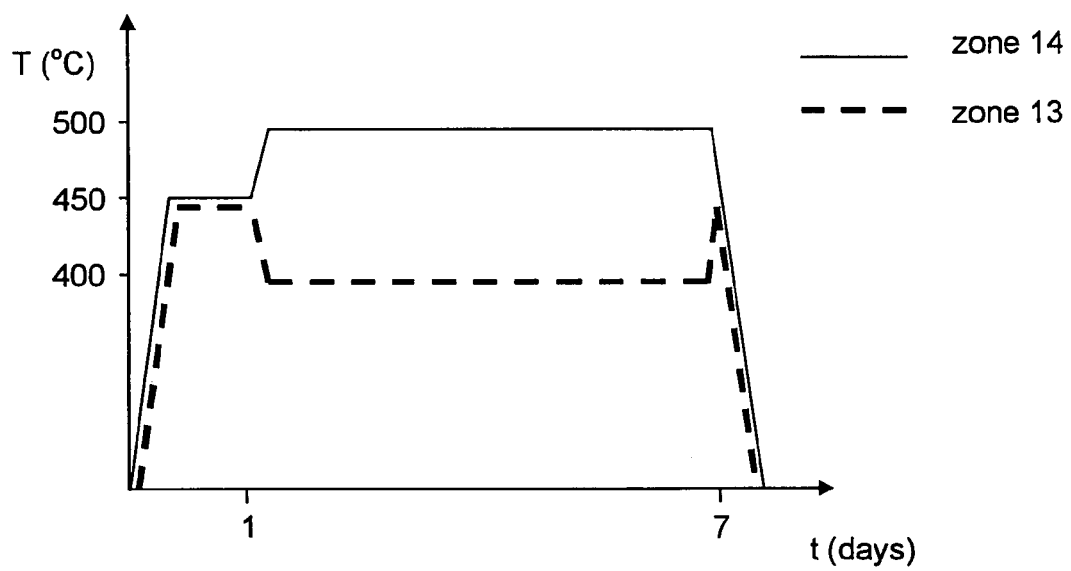
FIG. 4 shows a graph illustrating a change in temperature in an autoclave with the passage of time, in case of Example (3).
Figure 7:
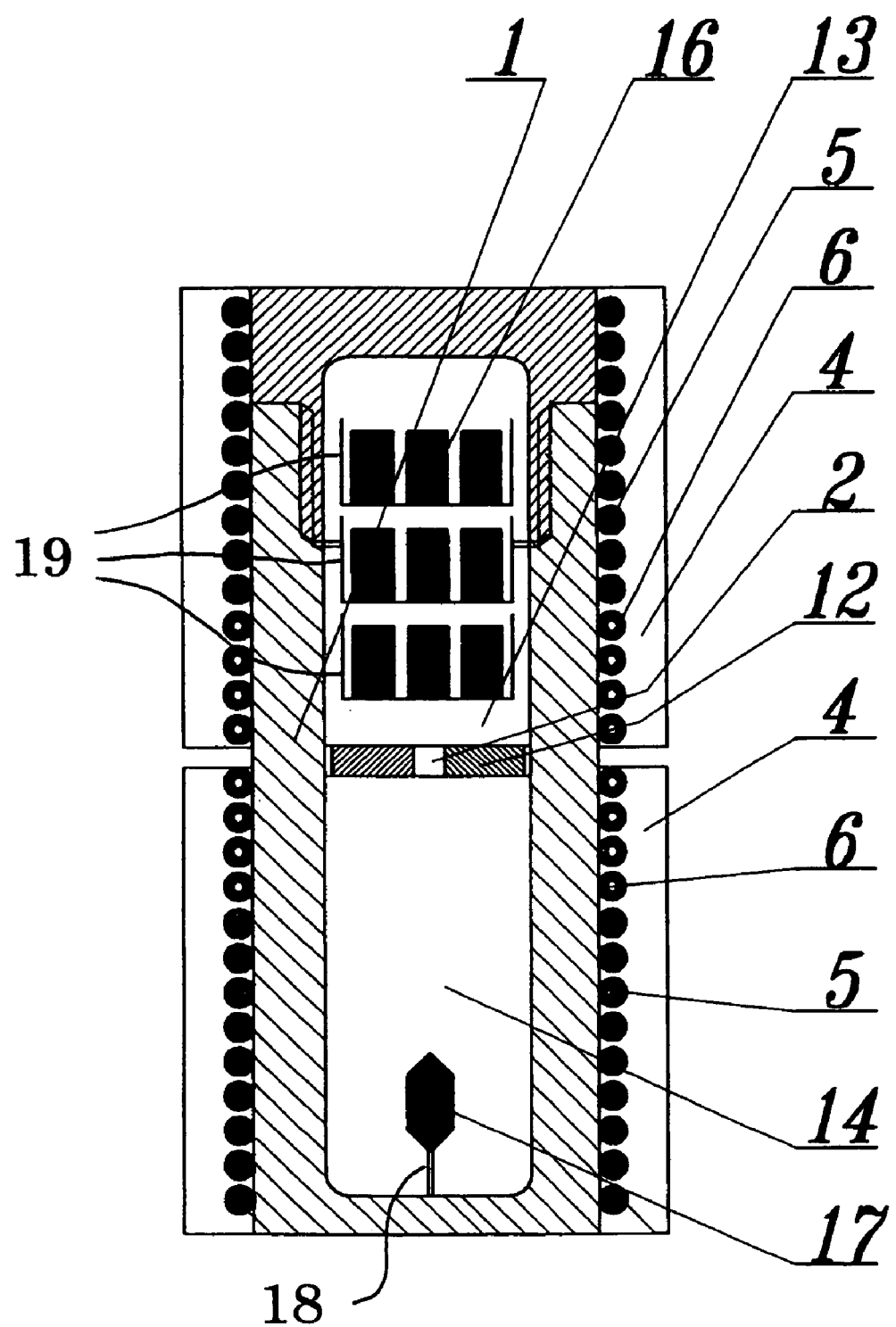
FIG. 7 is a schematic sectional view of an autoclave and a furnace unit used in Example 3, 4 and 5.
Figure 8:
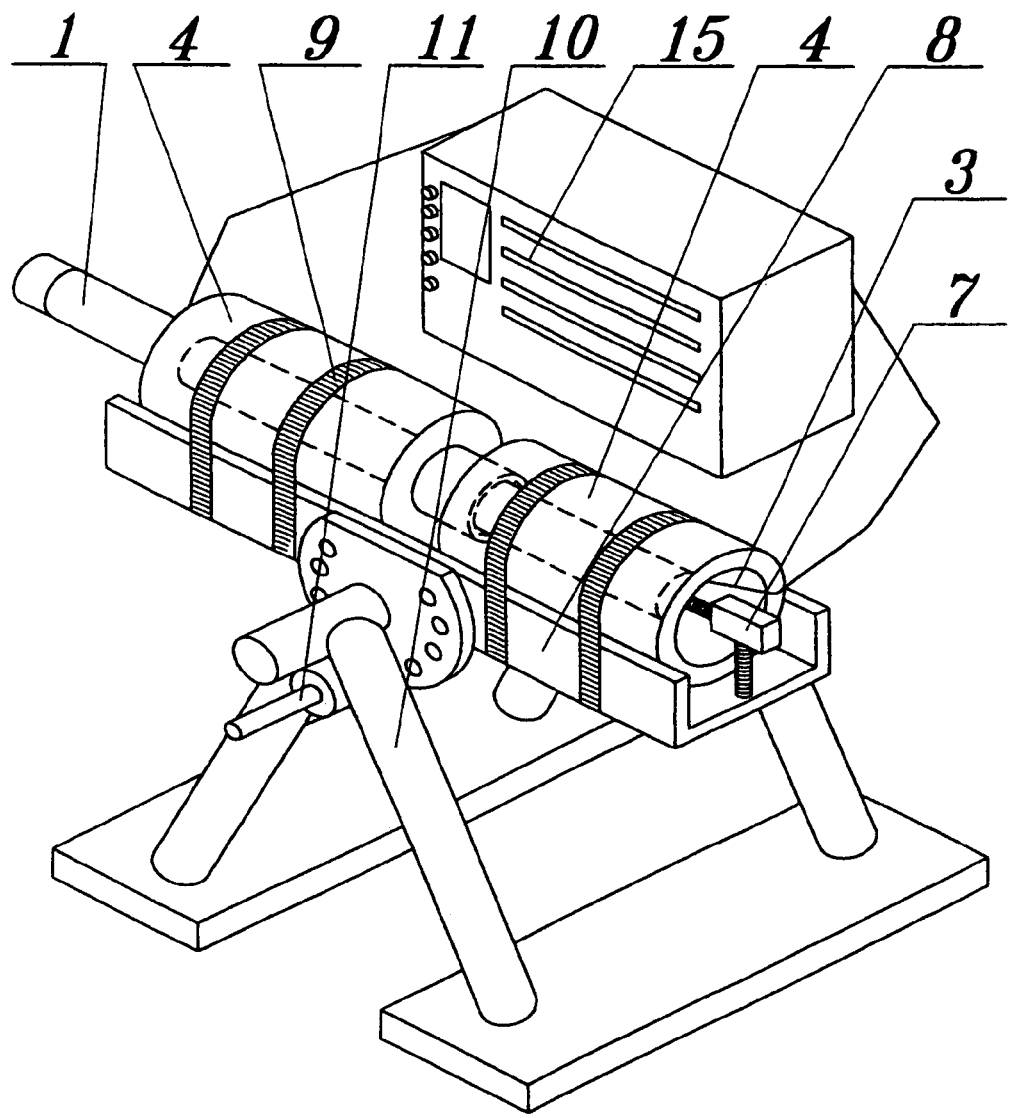
FIG. 8 is a schematic perspective view of an apparatus for forming a bulk monocrystalline gallium-containing nitride.

3.0 g of GaN prepared by Na flux method is distributed to the equal amount and each of them is placed respectively in the dissolution zone (13) and the crystallization zone (14) of the 35.6 cm$^3$ high-pressure autoclave (1) (FIG. 7). Next, the autoclave (1) is filled with 15.9 g of ammonia (5N) and closed. Autoclave (1) is then introduced into the furnace units (4) and heated to about 450° C. Pressure inside the autoclave is 2 kbar. After a day, the temperature of the crystallization zone (14) is increased to 500° C., and temperature of the dissolution zone (13) is decreased to 400° C. and the autoclave is maintained under those conditions for the next 6 days (FIG. 4). The process leads to partial dissolution of GaN in the dissolution zone (13) and the growth of gallium nitride on the GaN seed in the crystallization zone (14).

Example 4

Figure 5:
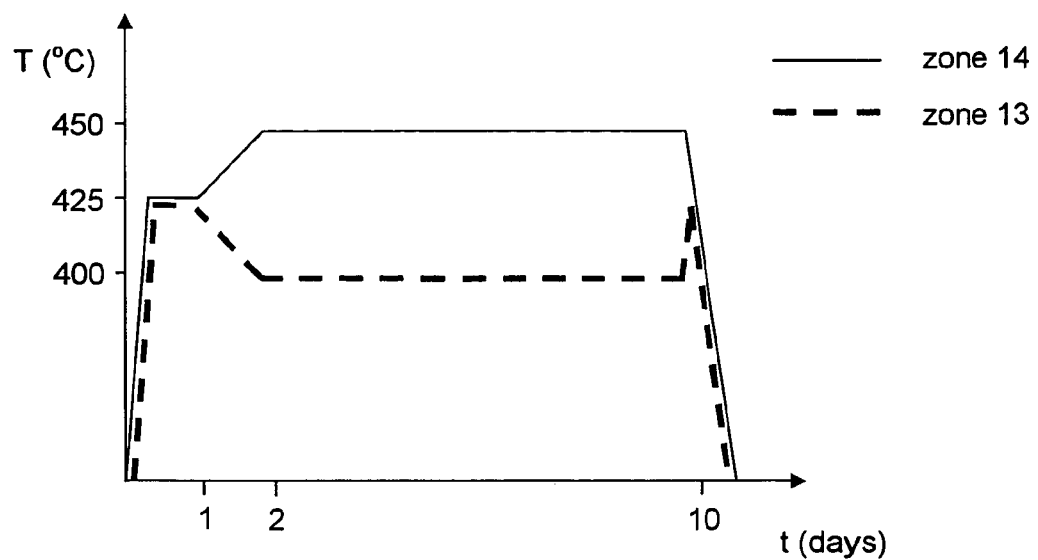
FIG. 5 shows a graph illustrating a change in temperature in an autoclave with the passage of time, in case of Example (4).

1.6 g of GaN feedstock prepared by Na flux method is placed in dissolution zone (13) of the 36 cm$^3$ high-pressure autoclave (1) (FIG. 7), 0.8 g of GaN seed prepared by HVPE method is placed in the crystallization zone (14), and 3.56 g of 4N purity metallic potassium is introduced. Next, the autoclave (1) is filled with 14.5 g of ammonia (5N) and closed. Autoclave (1) is then introduced into the furnace units (4) and heated to about 425° C. Pressure inside the autoclave is 1.5 kbar. After a day, the temperature of the dissolution zone (13) is decreased to 400° C., and temperature of the crystallization zone (14) is increased to 450° C. and the autoclave is maintained under those conditions for the next 8 days (FIG. 5). The process leads to partial dissolution of GaN in the dissolution zone (13) and the growth of gallium nitride on the HVPE•GaN seed in the crystallization zone (14). Both sides of the monocrystalline layer have a total thickness about 0.15 mm.

Example 5

Figure 6:
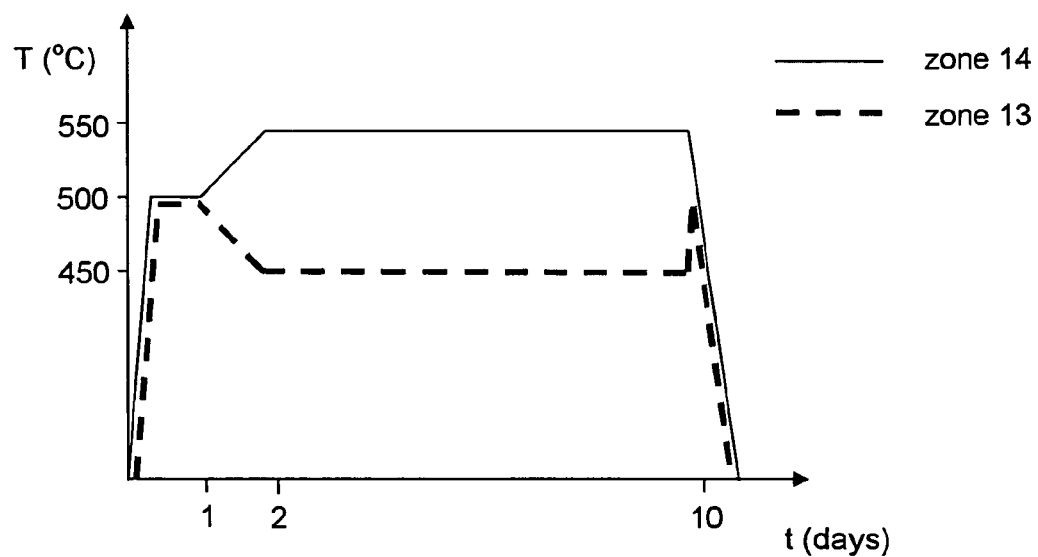
FIG. 6 shows a graph illustrating a change in temperature in an autoclave with the passage of time, in case of Example (5).

2 g of GaN feedstock prepared by Na flux method is placed and 0.47 g of 4N purity metallic potassium is introduced in dissolution zone (13) of the 36 cm$^3$ high-pressure autoclave (1) (FIG. 7), 0.7 g of GaN seed prepared by HVPE method is placed in the crystallization zone (14). Next, the autoclave (1) is filled with 16.5 g of ammonia (5N) and closed. Autoclave (1) is then introduced into the furnace units (4) and heated to about 500° C. Pressure inside the autoclave is 3 kbar. After a day, the temperature of the dissolution zone (13) is decreased to 450° C., and temperature of the crystallization zone (14) is increased to 550° C. and the autoclave is maintained under those conditions for the next 8 days (FIG. 6). The process leads to partial dissolution of GaN in the dissolution zone (13) and the growth of gallium nitride on the seed in the 25 crystallization zone (14). Both sides of the monocrystalline layer have a total thickness about 0.4 mm.

The process according to the present invention is carried out by using the apparatus which forms a bulk monocrystalline gallium-containing nitride in a supercritical solvent. This apparatus essentially comprises the autoclave (1) for producing the supercritical solvent, and the controller (2) which makes it possible to cause a chemical transport in the supercritical solution in the autoclave (1). This autoclave (1) is set in the chambers (3) of two furnace units (4) equipped with the heaters (5) or the coolers (6). The autoclave (1) is fixed with a bolt locking device (7) and held at a predetermined position relative to the furnace units (4). The furnace units (4) are placed on a hearth (8) and are wound together with the hearth (8) with a steel tape (9) so as to be fixed. The furnace units (4) with the hearth (8) are set on a turn table (10) and fixed thereto at a specified angle with a pin locking device (11) so that the type of convection and the convection speed in the autoclave (1) can be controlled. The convection of the supercritical solution in the autoclave (1) set in the furnace units (4) is controlled by the convection controller (2) which is composed of at least one horizontal baffle (12) having a hole at the center or at its periphery and which partitions the crystallization zone (14) from the dissolution zone (13). The temperatures of both zones in the autoclave (1) are set at 100 to 800° C., respectively, by a control unit (15) connected to the furnace units (4). The dissolution zone (13) in the autoclave (1) which corresponds to a lower temperature zone of one furnace unit (4) is located above the horizontal baffle (12), and includes the GaN(16) set therein. The crystallization zone (14) in the autoclave which corresponds to a higher temperature zone of the other furnace unit (4) is located below the horizontal baffle (12). The seed (17) is set in this zone (14), and specifically is located below an intersecting point of the upstream and the downstream in the convection.

INDUSTRIAL APPLICABILITY

The bulk monocrystalline gallium nitride thus obtained has a high crystalinity, and therefore can be applied to a substrate for optical devices such as laser diode, etc. which employ nitride semiconductors.

The invention claimed is:

1. A process for obtaining a bulk monocrystalline gallium nitride, comprising:

forming a supercritical ammonia solvent containing ion or ions of an alkali metal in an autoclave; dissolving a mass of monocrystalline gallium nitride in the supercritical ammonia solvent to form a supercritical solution in which the mass of monocrystalline gallium nitride is dissolved; and crystallizing gallium nitride on a face of a seed from the supercritical solution, under a condition of a higher temperature or a lower pressure than a temperature and a pressure under which the mass of monocrystalline gallium nitride is dissolved in the supercritical solvent.

2. The process according to claim 1, further comprising:

transferring the supercritical solution to a higher temperature or lower pressure zone, separately from the step of dissolving the mass of monocrystalline gallium nitride.

3. The process according to claim 1, which further comprises a step of providing at least two zones having a difference in temperature therebetween concurrently in the autoclave, and wherein the mass of monocrystalline gallium nitride is set in the lower temperature dissolution zone, and the seed, in the higher temperature crystallization zone.

4. The process according to claim 3, wherein the difference in temperature between the dissolution zone and the crystallization zone is set within such a range that a chemical transport in the supercritical solution can be ensured.

5. The process according to claim 4, wherein the chemical transport in the supercritical solution is caused mainly by convection in the autoclave.

6. The process according to claim 4, wherein the difference in temperature between the dissolution zone and the crystallization zone is 1° C. or more.

7. The process according to claim 1, wherein the mass of monocrystalline gallium nitride may contain a donor, an acceptor or a magnetic dopant.

8. The process according to claim 1, wherein the supercritical solvent contains $NH_3$ or its derivative.

9. The process according to claim 1, wherein the supercritical solvent contains at least ions of sodium or potassium.

10. The process according to claim 1, wherein the seed has a crystalline layer of a nitride containing at least gallium or other element of Group III.

11. The process according to claim 1, wherein the crystalline layer of gallium-containing nitride in the seed has a surface dislocation density of $10^6/cm^2$ or less.

12. The process according to claim 1, wherein said seed is the mass of monocrystalline gallium nitride.

13. The process according to claim 1, wherein the full width at half maximum (FWHM) of the X-ray rocking curve from (0002) plane of a surface of the seed is 120 arcsec or less.

14. The process according to claim 1, wherein the crystallization of gallium nitride is carried out at a temperature from 100 to 800° C., preferably 300 to 600° C., more preferably 400 to 550° C.

15. The process according to claim 1, wherein the crystallization of gallium nitride is carried out at a pressure from 100 to 10,000 bar, preferably 1,000 to 5,500 bar, more preferably 1,500 to 3,000 bar.

16. The process according to claim 1, wherein the concentration of the ions of the alkali metal in the supercritical solvent is adjusted so that a specified solubility of gallium nitride can be ensured.

17. The process according to claim 1, wherein the molar ratio of the ions of the alkali metal to other components in the supercritical solvent is controlled within a range of from 1:200 to 1:2, preferably from 1:100 to 1:5, more preferably from 1:20 to 1:8.

18. The process according to claim 1, wherein the mass of monocrystalline gallium nitride is prepared by a flux method.

19. The process according to claim 1, wherein the supercritical solvent contains at least ions of sodium or potassium.

20. A process for forming a bulk monocrystalline gallium nitride, comprising the steps of dissolving a mass of monocrystalline gallium nitride in a supercritical solvent containing ammonia and ion or ions of an alkali metal in an autoclave, to form a supercritical solution of gallium nitride whose solubility has a negative temperature coefficient; and selectively growing a crystal of gallium nitride only on the face of a seed arranged in the autoclave, from the supercritical solution introduced, by taking advantage of the negative temperature coefficient of the solubility of gallium nitride.

21. A process for forming a bulk monocrystalline gallium nitride, comprising the steps of dissolving a mass of monocrystalline gallium nitride in a supercritical solvent containing ammonia and ion or ions of an alkali metal in an autoclave, to form a supercritical solution of gallium nitride whose solubility has a positive pressure coefficient; and selectively growing a crystal of gallium nitride only on the face of a seed arranged in the autoclave, from the supercritical solution introduced, by taking advantage of the positive pressure coefficient of the solubility of gallium nitride.

22. The process according to claim 20 or 21, wherein the ion or ions of the alkali metals are introduced in the form of an alkali metal or a mineralizer containing no halogen.

23. The process according to claim 22, wherein the ion or ions of the alkali metals are of one or more than two selected from the group consisting of $Li^+$, $Na^+$ and $K^+$.

24. The process according to claim 20 or 21, wherein said seed is a mass of monocrystalline gallium nitride.

25. A process for forming a bulk monocrystalline gallium nitride, comprising the steps of dissolving in a supercritical solvent containing ammonia and ion or ions of alkali metals to form a supercritical solution of gallium nitride whose solubility has a negative temperature coefficient; adjusting the solubility of the supercritical solution below a level of concentration where no spontaneous crystallization occurs, while maintaining oversaturation of the supercritical solution relative to a seed by raising the temperature or reducing the pressure, at least, in a zone in the autoclave where the seed is arranged; and selectively growing a crystal of GaN only on the face of the seed arranged in the autoclave, from said supercritical solution.

26. The process according to claim 25, wherein two zones, comprising a dissolution zone and a crystallization zone, are concurrently formed in the autoclave, and wherein the oversaturation of the supercritical solution relative to the seed is controlled by controlling the dissolution temperature and the crystallization temperature.

27. The process according to claim 26, wherein the temperature of the crystallization zone is set at a temperature from 400 to 600° C.

28. The process according to claim 25, wherein a difference in temperature between the two zones comprising the dissolution zone and the crystallization zone, concurrently formed in the autoclave, is maintained to 150° C. or less, preferably 100° C. or less.

29. The process according to claim 25, wherein the oversaturation of the supercritical solution relative to the seed is adjusted by providing at least one baffle which partitions the lower temperature dissolution zone from the higher temperature crystallization zone, and controlling the convection amount between the dissolution zone and the crystallization zone.

30. The process according to claim 25, wherein a specified difference in temperature is set between the dissolution zone and the crystallization zone, formed in the autoclave, and wherein the oversaturation of the supercritical solution relative to the seed is adjusted by utilizing a mass of monocrystalline gallium nitride which is introduced as gallium nitride crystal having a total surface area larger than the total surface area of the seed.

31. The process according to claim 30, wherein the mass of monocrystalline gallium nitride is prepared by a flux method.

32. A process for obtaining a bulk monocrystalline gallium nitride, comprising:
dissolving a mass of monocrystalline gallium nitride in a supercritical ammonia solvent at a first temperature and a first pressure to form a supercritical solution in which the mass of monocrystalline gallium nitride is dissolved; and
crystallizing gallium nitride on a face of a seed from the supercritical solution at a second temperature and a second pressure, wherein the second temperature is higher than the first temperature and the second pressure is lower than the first pressure.

33. The process according to claim 32, further comprising:
transferring the supercritical solution to a higher temperature or lower pressure zone, separately from the step of dissolving the mass of monocrystalline gallium nitride prepared by a flux method.

34. The process according to claim 32, further comprising a step of providing at least two zones having a difference in temperature therebetween concurrently in the autoclave, and wherein the mass of monocrystalline gallium nitride prepared by a flux method is set in the lower temperature dissolution zone, and the seed, in the higher temperature crystallization zone.

35. The process according to claim 32, wherein the difference in temperature between the dissolution zone and the crystallization zone is set within such a range that a chemical transport in the supercritical solution can be ensured.

36. The process according to claim 32, wherein the chemical transport in the supercritical solution is caused mainly by convection in the autoclave.

37. The process according to claim 32, wherein the difference in temperature between the dissolution zone and the crystallization zone is 1° C. or more.

38. The process according to claim 32, wherein the mass of monocrystalline gallium nitride prepared by a flux method may contain a donor, an acceptor or a magnetic dopant.

39. The process according to claim 32, wherein the supercritical solvent contains $NH_3$ or its derivative.

40. The process according to claim 32, wherein the seed has a crystalline layer of a nitride containing at least gallium or other element of Group III.

41. The process according to claim 32, wherein the crystalline layer of gallium-containing nitride in the seed has a surface dislocation density of $10^6/cm^2$ or less.

42. The process according to claim 32, wherein said seed is the mass of monocrystalline gallium nitride prepared by a flux method.

43. The process according to claim 32, wherein the full width at half maximum (FWHM) of the X-ray rocking curve from (0002) plane of a surface of the seed is 120 arcsec or less.

44. The process according to claim 32, wherein the crystallization of gallium nitride is carried out at a temperature from 100 to 800° C., preferably 300 to 600° C., more preferably 400 to 550° C.

45. The process according to claim 32, wherein the crystallization of gallium nitride is carried out at a pressure from 100 to 10,000 bar, preferably 1,000 to 5,500 bar, more preferably 1,500 to 3,000 bar.

46. The process according to claim 32, wherein the concentration of the ions of the alkali metal in the supercritical solvent is adjusted so that a specified solubility of gallium nitride can be ensured.

47. The process according to claim 32, wherein the molar ratio of the ions of the alkali metal to other components in the supercritical solvent is controlled within a range of from 1:200 to 1:2, preferably from 1:100 to 1:5, more preferably from 1:20 to 1:8.

* * * * *

UNITED STATES PATENT AND TRADEMARK OFFICE
CERTIFICATE OF CORRECTION

PATENT NO.        : 7,081,162 B2                                              Page 1 of 1
APPLICATION NO.   : 10/479856
DATED             : July 25, 2006
INVENTOR(S)       : Robert Dwilinski et al.

It is certified that error appears in the above-identified patent and that said Letters Patent is hereby corrected as shown below:

Title Page item #73

In addition to the Assignee already listed on the patent, please add the following Assignee:

AMMONO SP.ZO.O, Warsaw (PO)

Signed and Sealed this

Second Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 7,081,162 B2
APPLICATION NO. : 10/479856
DATED : July 25, 2006
INVENTOR(S) : Robert Dwilinski et al.

It is certified that error appears in the above-identified patent and that said Letters Patent is hereby corrected as shown below:

On the Title page, in section (73) Assignee:

Please replace "AMMONO SP.ZO.O," with --AMMONO SP.ZO.O.--.

Signed and Sealed this

Nineteenth Day of August, 2008

JON W. DUDAS
*Director of the United States Patent and Trademark Office*